United States Patent [19]

Cutsogeorge

[11] 3,781,870

[45] Dec. 25, 1973

[54] VOLTAGE TO PULSE WIDTH CONVERTER

[75] Inventor: George Athan Cutsogeorge, Princeton, N.J.

[73] Assignee: RCA Corporation, New York, N.Y.

[22] Filed: Apr. 20, 1972

[21] Appl. No.: 245,861

[52] U.S. Cl. .................... 340/347 AD, 340/347 NT

[51] Int. Cl. .......................................... H03k 13/02

[58] Field of Search .................... 328/129, 133, 155; 331/1, 17, 18; 340/205, 206, 347 AD, 347 NT; 324/82; 332/9; 307/235, 234

[56] References Cited

UNITED STATES PATENTS

| | | | |
|---|---|---|---|
| 3,305,856 | 2/1967 | Jenkinson | 340/347 NT |
| 3,389,271 | 6/1968 | Gray | 340/347 NT |
| 3,390,354 | 6/1968 | Munch | 340/347 NT |
| 3,505,614 | 4/1970 | Marthe | 340/347 NT |

*Primary Examiner*—Maynard R. Wilbur
*Assistant Examiner*—Jeremiah Glassman
*Attorney*—Edward J. Norton et al.

[57] ABSTRACT

A circuit for converting an input voltage, the polarity and magnitude of which may vary, into two sets of pulses, one for each polarity of input voltage. The width of each pulse is related to the magnitude of the input voltage. The circuit includes a feedback arrangement to enhance the accuracy of the circuit.

8 Claims, 2 Drawing Figures

VOLTAGE TO PULSE WIDTH CONVERTER

The invention herein described was made in the course of or under a contract or subcontract thereunder with the Department of the Navy.

This invention relates to analog to digital conversion circuits and more particularly to circuits for converting an analog input signal to a variable duty cycle, digital signal whose duty cycle depends upon the magnitude of the input analog signal.

Circuits for converting analog signals into digital signals find a wide variety of uses. One such use is in the area of digital voltage controlled oscillators (VCO). In this area an analog error signal is used to generate a particular digital signal which will increase or decrease the output repetition rate of a digital VCO to maintain the output repetition rate at a constant value.

One approach to the conversion of an analog error signal into a digital frequency correction para-meter is the utilization of an open loop analog to digital processor. In this approach the analog error signal is applied to one input terminal of an amplifier set up as a comparator. A reference signal such as a sawtooth waveform at a clock frequency is applied to the other input terminal of the comparator. The output signal is a series of pulses whose pulse width is dependent upon the amplitudes of the signals applied to the input terminals relative to each other.

The problem with the open loop analog to digital approach is that for some applications the stability of this approach is not great enough. The present invention provides a solution to the stability problem in a voltage to pulse width converter by the utilization of a closed loop technique.

In accordance with the present invention there is provided a circuit for generating two sets of output pulses in response to an analog input signal which may vary in polarity and magnitude. The circuit comprises a first means which provides a series of pulses in response to the input signal. The pulse width of these pulses are related to the magnitude or absolute value of the input signal. There is also provided a means for generating a pulse train at a certain frequency. Means are further provided for generating a first and a second set of output pulses in response to the series of pulses and the pulse train. The first set of output pulses is generated when the input signal is at one polarity and the second set of output pulses is generated when the input signal is at another polarity. All of the output pulses have pulse widths related to the absolute value of the magnitude of the input signal. In addition, means are provided for supplying feedback signals, in response to the output pulses, to the first mentioned means in a manner which tends to stabilize the pulse width of the series of pulses provided by the first means.

Figure 1:
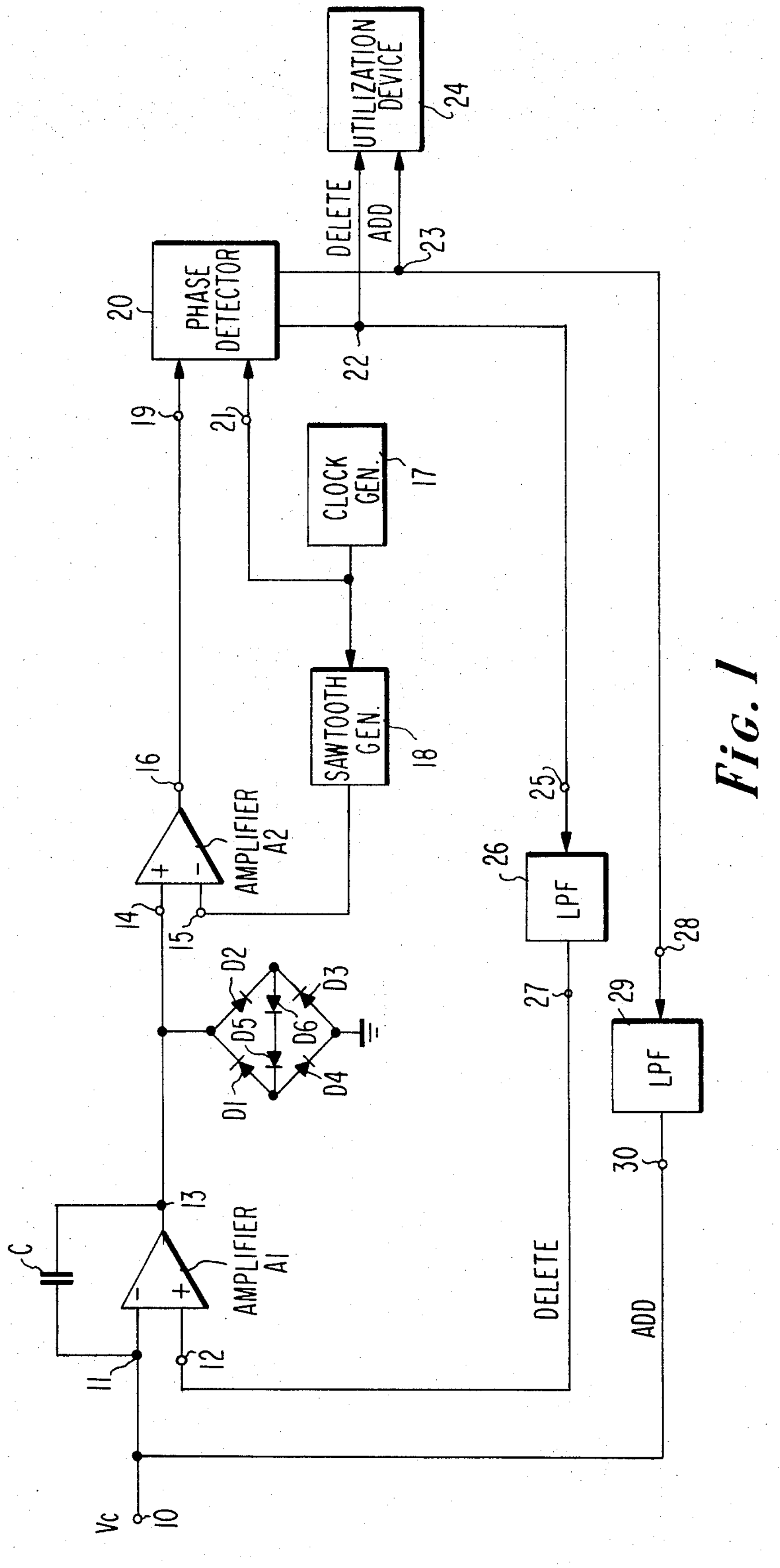
FIG. 1 is a partial block and schematic diagram of one embodiment of the invention.

Referring now to FIG. 1, the input analog signal $V_c$ is applied to a circuit input terminal 10. In the particular embodiment shown in FIG. 1, the analog signal $V_c$ is a slowly varying signal whose frequency may lie in the range of 0 to 100 Hertz. The input signal $V_c$ may be viewed as a control signal originating from some other equipment (not shown).

The input signal $V_c$ is coupled from terminal 10 to one input terminal of amplifier $A_1$. Amplifier $A_1$ has two input terminals 11 and 12 and an output terminal 13. Input terminal 11 of amplifier $A_1$, to which the signal $V_c$ is applied, is designated as the inverting input terminal of amplifier $A_1$, whereas, input terminal 12 of amplifier $A_1$ is designated as a non-inverting input terminal. In addition, there is provided a capacitor C connected between input terminal 11 and output terminal 13 of amplifier $A_1$. The output signal appearing at terminal 13 will be the integral of the difference between the signals applied to terminals 12 and 11.

There is also provided a clamping circuit comprised of diodes $D_1$ to $D_6$. Diodes $D_1$to $D_4$are connected in a bridge arrangement with the cathode electrode of diode $D_1$ connected to the anode electrode of diode $D_2$ with the last named connection being connected to output terminal 13 of amplifier $A_1$. The cathode electrode of diode $D_4$ is connected to the anode electrode of diode $D_3$ with the last named connection being connected to a point at ground potential. Diodes $D_5$ and $D_6$ are connected in series with each other with the anode electrode of diode $D_6$ connected to the cathode electrode of diode $D_2$ and to the cathode electrode of diode $D_3$. The cathode electrode of diode $D_5$ is connected to the anode electrode of diode $D_1$ and to the anode electrode of diode $D_4$. Diodes $D_1$ to $D_6$ provide a clamping function to keep the signal at the output terminal 13 of amplifier $A_1$ within the bounds of plus and minus 2.8 volts.

Terminal 13 of amplifier $A_1$ also has a connection to input terminal 14 of amplifier $A_2$ which is a non-inverting input terminal. Amplifier $A_2$ also has an inverting input terminal 15 and an output terminal 16. Amplifier $A_2$ is arranged to function as a differential comparator.

A clock signal having a certain frequency is provided by the clock generator 17. The frequency of the clock signal is the embodiment of the invention shown in FIG. 1 is 1 Megahertz. The clock signal is supplied to a sawtooth generator 18 which provides a sawtooth waveform at a frequency of 1 Megahertz to the inverting input terminal 15 of amplifier $A_2$.

The output terminal 16 of amplifier $A_2$ is electrically connected to an input terminal 19 of phase detector 20. The clock signal from the clock generator 17 is coupled to another input terminal 21 of the phase detector 20. Phase detector 20 has two output terminals 22 and 23 respectively.

A utilization device 24 such as the additional circuitry of a digital voltage controlled oscillator is electrically connected to terminals 22 and 23 of phase detector 20. For reasons which will be explained more fully herein, the electrical lines having a connection to terminal 22 are designated delete lines and the lines connected to terminal 23 are designated add lines.

The input terminal 25 of a low pass filter 26 is electrically connected to output terminal 22 of phase detector 20. The output terminal 27 of low pass filter 26 is electrically connected to input terminal 12 of amplifier $A_1$. In addition, input terminal 28 of low pass filter 29 is electrically connected to output terminal 23 of phase detector 20. Output terminal 30 of low pass filter 29 is electrically connected to input terminal 11 of amplifier A. Low pass filters 26 and 29 both have cutoff frequencies which are typically on the order of 1,000 Hertz.

Figure 2:
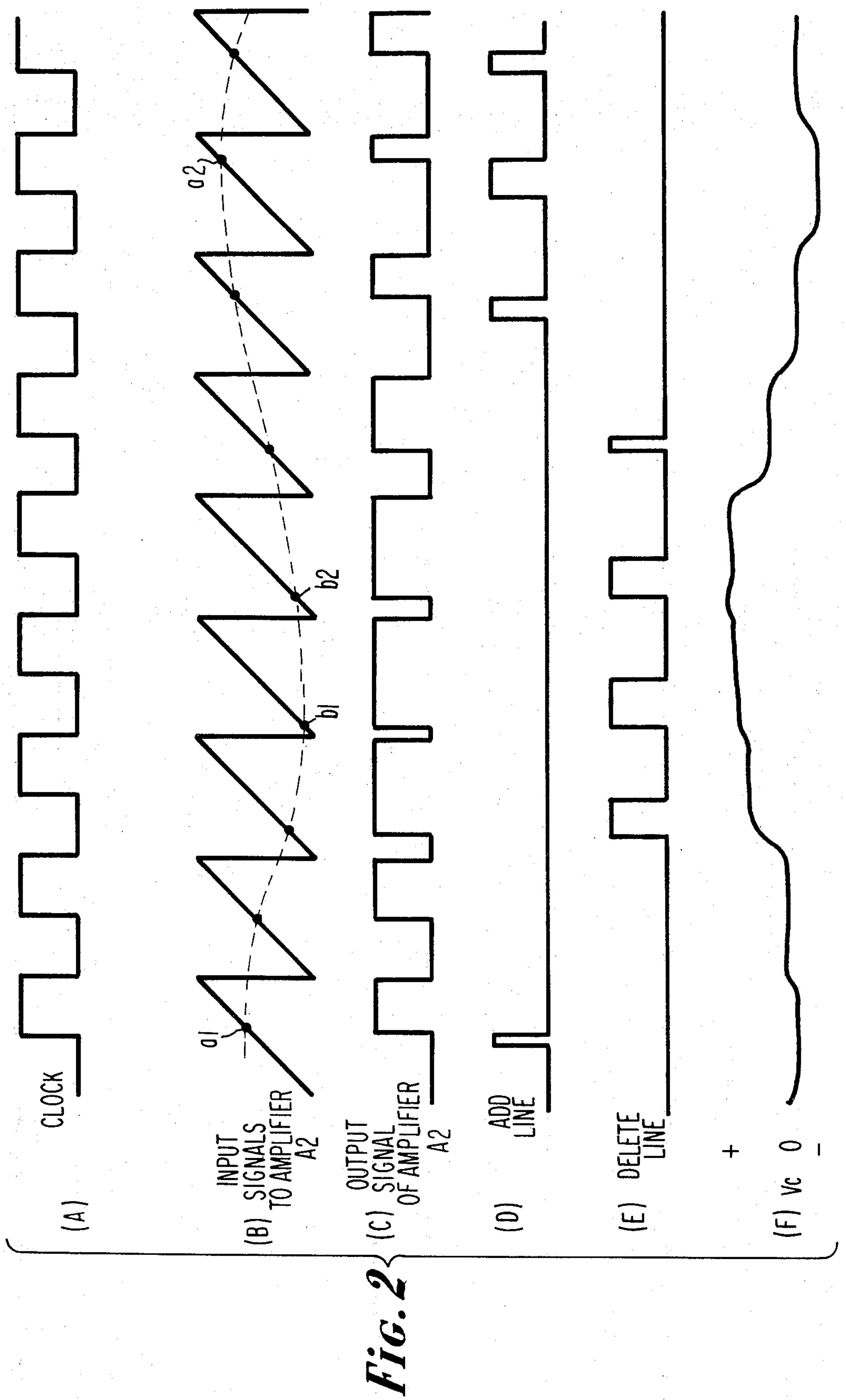
FIGS. 2A – 2F are signal waveforms useful in explaining the embodiment shown in FIG. 1.

The operation of the embodiment of the invention shown in FIG. 1 will be best understood by reference to the waveforms shown in FIGS. 2A to 2F. FIG. 2F shows a typical waveform for the analog input voltage $V_c$. The signal $V_c$ is a slowly varying signal as compared to the clock signal shown in FIG. 2A. It should be noted that the signal $V_c$ may vary in amplitude and polarity. Since the input signal $V_c$ is applied to the inverting input terminal 11 of amplifier $A_1$, the output signal appearing at terminal 13 of amplifier $A_1$ will tend to go down as the input signal $V_c$ tends to go above some quiescent level, say for example, 0 volts.

The signals applied to the input terminals 14 and 15 of amplifier $A_2$ are shown in FIG. 2B with the dashed line being the signal applied to input terminal 14 and the sawtooth waveform being applied to input terminal 15 of amplifier $A_2$. Amplifier $A_2$ is arranged such that when the signal applied to input terminal 14 has an amplitude which is equal to a particular voltage at the crossover of the two waveforms, a pulse is provided at output terminal 16 of amplifier $A_2$ having a pulse width equal to the pulse width of the pulses in the clock waveform shown in FIG. 2A.

When the signal at input terminal 14 tends to rise above this certain level which happens to be, in this case, the midpoint on the sloping portion of the sawtooth, the output pulse appearing at terminal 16 has a pulse width which is narrower than the clock pulses. Such a condition may be seen by correlating crossover points $a_1$ and $a_2$ in FIG. 2B with the corresponding output pulses shown in FIG. 2C.

When the input signal at terminal 14 falls below the aforementioned certain value at the crossover of the two waveforms, the output pulse appearing at terminal 16 of amplifier $A_2$ has a pulse width which is larger than the pulse width of the clock signal waveform. Such a condition may be seen from the crossover points $b_1$ and $b_2$ in FIG. 2B in connection with the corresponding output pulses at terminal 16 which are shown in FIG. 2C.

Thus far the arrangement of FIG. 1 has provided circuitry for generating pulses wherein the pulse widths of the generated pulses are determined by the absolute value of the magnitude of the input signal $V_c$. In effect, a set of pulses have been generated having one fixed edge and one movable edge, the location of the movable edge being determined by the amplitude of the signal applied to terminal 14 of amplifier $A_2$.

This series of pulses appearing at terminal 16 of amplifier $A_2$ are applied to input terminal 19 of phase detector 20. The clock signal is applied to input terminal 21 of phase detector 20. When the pulses applied to input terminal 19 lag the clock pulses applied to terminal 21 a pulse having a pulse width which is the difference of the two pulses applied to terminals 19 and 21, will appear at output terminal 23 and, therefore, on the add lines. This situation may be seen by comparing the clock pulses in FIG. 2A with the output pulses from amplifier $A_2$ in FIG. 2C with the corresponding generated pulses on the add line in FIG. 2D.

When the pulses applied to input terminal 19 lead the clock pulses applied to terminal 21, phase detector 20 will generate a pulse at terminal 22 having a pulse width corresponding to the difference in pulse widths of the signals applied to terminals 19 and 21. This may be seen by comparing the clock pulses in FIG. 2A with the series of pulses in FIG. 2C and the corresponding pulses supplied to the delete line which appears at terminal 22 in FIG. 2E.

The pulses at both output terminals 22 and 23 have pulse widths which are related to the absolute value of the signal applied at the input terminal 11 of amplifier $A_1$. In addition, the arrangement has provided a set of pulses at one terminal when the input signal is at one polarity and at the other output terminal when the input signal is at another polarity. When the input signal is at a quiescent value, no output pulses appear at either of the terminals. Thus, the utilization device 24 may use this information to control some particular parameter, such as the output frequency of a digitally controlled oscillator.

In the situation where the input signal falls slightly below a quiescent value and a pulse is generated at output terminal 23 of phase detector 20, this pulse is passed through low pass filter 29 and the low frequency components are supplied at input terminal 11 of amplifier $A_1$. This feedback signal tends to drive the signal appearing at terminal 14 of amplifier $A_2$ to a lower value, thus providing a pulse at terminal 16 which is closer to the pulse width of the pulses in the clock signal.

When the input signal tends to rise above the quiescent value, a pulse is provided at output terminal 22 of phase detector 20 which passes through low pass filter 26 and the low frequency components are then applied to input terminal 12 of amplifier $A_1$. By adding signal strength at terminal 12, the signal appearing at terminal 14 of amplifier $A_2$ tends to rise and thus tends to generate pulses at output terminal 16 of amplifier $A_2$ which are more nearly equal in pulse width to the pulse width of the clock signal waveform. It will be seen from the above that when the input signal $V_c$ is at its quiescent value, there are no pulses generated at output terminals 22 or 23 of phase detector 20.

It has been found that the two feedback paths starting at output terminals 22 and 23 which couple back to input terminals 12 and 11 of amplifier $A_1$ respectively, considerably increase the accuracy of the system. When an integrator, such as amplifier $A_1$, is used in a feedback or closed loop system there is no position error in the output signal. This is a result of the fact that as long as any error exists between the input signal and the feedback signal at the input terminals of amplifier $A_1$, the output signal generated by amplifier $A_1$ will be increasing or decreasing and hence the overall circuit output signal will be changing. When the feedback signal exactly cancels the input signal at the input terminals of amplifier $A_1$, the output signal from amplifier $A_1$ stops changing. Under these conditions the output signal from amplifier $A_1$ need not be zero but may sit at some voltage, representing various offsets and errors in the overall feedback loop, such that the circuit output pulse width is an exact analog of the input voltage.

What is claimed is:

1. A circuit for generating a first and a second set of output pulses on first and second output lines, respectively, in response to an input signal the polarity and magnitude of which may vary, said circuit comprising:

first means comprising a first and second amplifier each having two input terminals and an output terminal, the output terminal of the first amplifier being connected to one input terminal of the second amplifier, a series of pulses being provided at the output terminal of the second amplifier, the pulse width of each of the pulses in said series being related to the absolute value of the magnitude of said input signal;

second means for supplying a pulse train having a certain frequency of repetition;

means responsive to said pulse train for providing a reference signal;

means adapted for applying said reference signal to the other input terminal of said second amplifier;

third means responsive to said pulse train and to said series of pulses for providing said first set of output pulses on said first output line when the input signal is at one polarity and for providing said second set of output pulses on said second output line when the input signal is at another polarity;

means adapted for applying said input signal and one feedback signal related to one of said sets of output pulses to one input terminal of said first amplifier; and means adapted for applying another feedback signal related to the other set of output pulses to the other input terminal of said first amplifier.

2. The circuit according to claim 1 wherein said means responsive to said pulse train for providing a reference signal comprises a sawtooth wave generator.

3. The circuit according to claim 1 wherein said third means comprises a phase detector having two input terminals and two output lines, one input terminal being connected to the second amplifier output terminal and the other input terminal being connected to said means for providing a pulse train, said first set of output pulses being provided on said first output line when the signal applied to the first input terminal of the phase detector leads the pulses of said pulse train applied to said other input terminal of the phase detector, said second set of output pulses being provided on said second output line when the signal applied to the first input terminal of the phase detector lags the pulses of said pulse train applied to said other input terminal thereof.

4. The circuit according to claim 3 wherein said means for providing a feedback signal includes a first and second low pass filter respectively connected with each of said first and second output lines.

5. The circuit according to claim 4 further including a utilization device resonsive to said first and second sets of output pulses.

6. The circuit according to claim 4 wherein said first amplifier is an integrating amplifier and wherein the input terminals of said first and second amplifiers comprise inverting and non-inverting input terminals.

7. The circuit according to claim 6 wherein the input signal is applied to the inverting input terminal of said first amplifier, the non-inverting input terminal of said first amplifier being connected to said first low pass filter, the inverting input terminal of said first amplifier also being connected to said second low pass filter.

8. The circuit according to claim 7 wherein the output terminal of said first amplifier has a connection to the non-inverting input terminal of the second amplifier, the reference signal being applied to the inverting input terminal of the second amplifier.

* * * * *